US008004364B2

(12) United States Patent
Sims, III et al.

(10) Patent No.: US 8,004,364 B2
(45) Date of Patent: Aug. 23, 2011

(54) HIGH POWER RF SOLID STATE POWER AMPLIFIER SYSTEM

(75) Inventors: William Herbert Sims, III, New Market, AL (US); Donald Gregory Chavers, Somerville, AL (US); James J. Richeson, Madison, AL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 466 days.

(21) Appl. No.: 11/828,563

(22) Filed: Jul. 26, 2007

(65) Prior Publication Data

US 2009/0027129 A1    Jan. 29, 2009

Related U.S. Application Data

(60) Provisional application No. 60/879,209, filed on Dec. 22, 2006.

(51) Int. Cl.
*H03F 3/68* (2006.01)
(52) U.S. Cl. .................................. 330/295; 330/124 R
(58) Field of Classification Search .................. 330/53, 330/84, 124 R, 286, 295
See application file for complete search history.

(56) References Cited

U.S. PATENT DOCUMENTS

| 4,724,400 | A | | 2/1988 | Luettgenau |
| 5,119,042 | A | | 6/1992 | Crampton et al. |
| 5,204,637 | A | * | 4/1993 | Trinh ............................. 330/129 |
| 5,256,987 | A | | 10/1993 | Kibayashi et al. |
| 5,561,395 | A | | 10/1996 | Melton et al. |
| 5,793,253 | A | | 8/1998 | Kumar et al. |
| 5,831,479 | A | | 11/1998 | Leffel et al. |
| 5,867,060 | A | | 2/1999 | Burkett, Jr. et al. |
| 6,020,787 | A | * | 2/2000 | Kim et al. ..................... 330/279 |
| 6,037,840 | A | | 3/2000 | Myer |
| 6,507,243 | B2 | | 1/2003 | Harris et al. |
| 6,646,504 | B2 | | 11/2003 | Dittmer et al. |
| 6,650,200 | B2 | | 11/2003 | Culliton et al. |
| 6,887,339 | B1 | | 5/2005 | Goodman et al. |
| 6,982,613 | B2 | | 1/2006 | Wu et al. |
| 2003/0215373 | A1 | | 11/2003 | Reyzelman et al. |

* cited by examiner

*Primary Examiner* — Robert Pascal
*Assistant Examiner* — Khiem D Nguyen
(74) *Attorney, Agent, or Firm* — Ross F. Hunt, Jr.; Douglas E. Jackson; James J. McGroary

(57) ABSTRACT

A high power, high frequency, solid state power amplifier system includes a plurality of input multiple port splitters for receiving a high-frequency input and for dividing the input into a plurality of outputs and a plurality of solid state amplifier units. Each amplifier unit includes a plurality of amplifiers, and each amplifier is individually connected to one of the outputs of multiport splitters and produces a corresponding amplified output. A plurality of multiport combiners combine the amplified outputs of the amplifiers of each of the amplifier units to a combined output. Automatic level control protection circuitry protects the amplifiers and maintains a substantial constant amplifier power output.

10 Claims, 3 Drawing Sheets

HIGH POWER RF SOLID STATE POWER AMPLIFIER SYSTEM

CROSS-REFERENCES TO RELATED APPLICATIONS

This application claims the benefit of U.S. Provisional Application Ser. No. 60/879,209 filed on Dec. 22, 2006.

ORIGIN OF THE INVENTION

The invention described herein was made in the performance of work under a NASA contract and by an employee of the United States Government and is subject to the provisions of Public Law 96-517 (35 U.S.C. §202) and may be manufactured and used by or for the Government for governmental purposes without the payment of any royalties thereon ore therefore. In accordance with 35 U.S.C. §202, the contractor has elected not to retain title.

FIELD OF THE INVENTION

The present invention relates to power amplifiers and, more particularly, to solid state RF power amplifiers.

BACKGROUND OF THE INVENTION

Current state-of-the-art power amplifier systems incorporate only single modules to generate the required power output. The power output levels of solid state power amplifiers are quite low as compared with current vacuum tube power amplifiers. In this regard, state-of-the-art power amplifiers are capable of generating power at levels on the order of tens of megawatts or more. In contrast, the highest power levels generated by solid state amplifiers is on the order of 1-5 kilowatts, levels which are hundreds and even thousands of times lower than power amplifiers employing vacuum tube technology. Because of this, existing state-of-the-art power amplification at high power levels has been almost exclusively been provided by vacuum tube amplifiers.

One serious drawback associated with vacuum tube amplifiers is the enormous weight impact of such amplifiers on the overall system. This is, of course, quite important in systems, such as space vehicle applications, wherein weight is critical. Solid state power amplifiers do not suffer from this disadvantage. For example, a vacuum amplifier typically generates 1 watt of output power for every approximately one to five pounds of weight depending on the power levels while current solid state amplifiers generate 1 watt of output power for every 0.1 to one pound, again depending on the power levels involved.

SUMMARY OF THE INVENTION

Generally speaking, one aspect of the invention concerns the provision of a solid state, high frequency power amplifier system wherein the operational power levels are significantly increased. In the latter regard, the systems constructed in accordance with the principles of the invention have the capability of generating tens or even hundreds of kilowatts of RF power. Moreover, these power levels can be generated with a solid state system of significantly reduced weight as compared with currently used vacuum tube amplifiers. A further important advantage of embodiments of the invention is that the power amplifier system provides a "graceful" degradation of output power, e.g., in the event of the failure of one or more stages in the system, the overall system continues to operate, albeit at a reduced power level.

In accordance with one aspect of the invention, there is provided a high power, high frequency a high power, high frequency, solid state power amplifier system, comprising:

at least one input multiple port splitter for receiving a high-frequency input and for dividing the input into a plurality of outputs;

a plurality of solid state amplifier units, each amplifier unit including a plurality of amplifiers, and each amplifier being individually connected to one of the plurality of outputs of said further multiport splitters, and producing a corresponding amplified output;

at least output multiport combiner for combining the amplified outputs of the amplifiers of each of the amplifier units to produce a combined output; and each of said amplifiers comprising a plurality of power amplifier stages and an automatic level control protection circuit for protecting the amplifier and for maintaining a substantially constant amplifier power output.

Preferably, the protection circuit protects the associated amplifier from excess power operation, high voltage standing wave ratio operation and high current.

In one preferred embodiment, the protection circuit receives a plurality of inputs related to the operational state of the corresponding amplifier and produces a related output, and each of said amplifiers comprises a variable power attenuator, connected to one of the plurality of outputs of the at least one multiple port splitter and to the output of the protection circuit, for controlling the high frequency input drive to a first amplifier stage of said plurality of amplifier stages. Advantageously, the variable power attenuator comprises a PIN diode attenuator.

The protection circuit includes a directional coupler connected to the output of said amplifier stages for sampling the forward power component and reflected power component of the amplifier power output.

Preferably first and second separate operational amplifiers are used in producing outputs related to the forward power component and the reflected power component, the forward power component is determined by a user controlled forward power setting, and the protection circuit provides that as long as the reflected power component does not exceed a predetermined level, the amplifier power output is limited the forward power setting.

The protection circuit preferably further comprises a current monitor for monitoring DC amplifier current and for reducing the amplifier power output when the DC amplifier current exceeds a predetermined level. Advantageously, the current monitor comprises a resistive component connected in series in a power supply connection to the plurality of amplifier stages.

Preferably, the protection circuit includes an operational amplifier for comparing said the forward power component and said reflected power component and for providing an output indicative of voltage standing wave ratio.

The protection circuit preferably includes an input terminal for receiving an external voltage level so as to enable shaping of the amplifier power output.

Preferably, the protection circuit further comprises a summer, connected to each of the operational amplifiers and said variable power attenuator, for summing the outputs of the operational amplifiers and for supplying a corresponding output to said variable power attenuator.

According to a further aspect of the invention, there is provided a high power, high frequency, solid state power amplifier system, comprising:

an input multiple port splitter for receiving a high-frequency input and for dividing the input into a plurality of outputs;

a plurality of further multiport splitters, said multiport splitters being equal in number to the number of outputs of the input splitter and each being individually connected to a respective output of said plurality of outputs, and each of said further multiport splitters producing a further plurality of outputs;

a plurality of solid state amplifier units, each amplifier unit including a plurality of amplifiers, and each amplifier being individually connected to one of the further plurality of outputs of said further multiport splitters and producing a corresponding amplified output;

a plurality of multiport combiner, equal in number to the number of further multiport splitters, for combining the amplifier outputs of the amplifiers of each of the amplifier units to produce a plurality of combined outputs; and an output multiport combiner for combining the plurality of combined outputs.

As above, each of said amplifiers preferably comprises a plurality of power amplifier stages and an automatic level control protection circuit for maintaining a substantially constant amplifier power output.

The protection circuit preferably protects the associated amplifier from excess power operation, high voltage standing wave ratio operation and high current.

As above, in a preferred embodiment, the protection circuit receives a plurality of inputs related to the operational state of the corresponding amplifier and produces a related output, and each of said amplifiers comprises a variable power attenuator, connected to one of the plurality of outputs of the at least one multiple port splitter and to the output of the protection circuit, for controlling the high frequency input drive to a first amplifier stage of said plurality of amplifier stages. Advantageously, variable power attenuator comprises a PIN diode attenuator.

Preferably, the protection circuit includes a directional coupler connected to the output of said amplifier stages for sampling the forward power component and reflected power component of the amplifier power output.

Preferably, first and second separate operational amplifiers are used in producing outputs related to the forward power component and the reflected power component, wherein the forward power component is determined by a user controlled forward power setting, and the protection circuit provides that as long as the reflected power component does not exceed a predetermined level, the amplifier power output is limited to the forward power setting, said protection circuit further comprising current monitor for monitoring DC amplifier current and for reducing the amplifier power output when the DC amplifier current exceeds a predetermined level, and said current monitor comprising a resistive component connected in series in a power supply connection to the plurality of amplifier stages.

Preferably, the protection circuit includes an operational amplifier for comparing said the forward power component and said reflected power component and for providing an output indicative of voltage standing wave ratio, said protection circuit includes an input terminal for receiving an external voltage level so as to enable shaping of the amplifier power output, and said protection circuit further comprises a summer, connected to each of the operational amplifiers and said variable power attenuator for summing the outputs of the operational amplifiers and for supplying a corresponding output to said variable power attenuator.

According to yet another aspect of the invention, there is provided a high power, high frequency, solid state power amplifier system, comprising:

an input multiple port splitter for receiving a high-frequency input and for dividing the input into a plurality of outputs;

a plurality of further multiport splitters, said multiport splitters being equal in number to the number of outputs of the input splitter and each being individually connected to a respective output of said plurality of outputs, and each of said further multiport splitters producing a further plurality of outputs;

a plurality of solid state amplifier units, each amplifier unit including a plurality of amplifiers, and each amplifier being individually connected to one of the further plurality of outputs of said further multiport splitters and producing a corresponding amplified output;

a plurality of multiport combiner, equal in number to the number of further multiport splitters, for combining the amplifier outputs of the amplifiers of each of the amplifier units to produce a plurality of combined outputs; and an output multiport combiner for combining the plurality of combined outputs to produce a combined power output, control protection circuit for maintaining the amplified output of the associated amplifier substantially constant.

Further features and advantages of the present invention will be set forth in, or apparent from, the detailed description of preferred embodiments thereof which follows.

DESCRIPTION OF THE PREFERRED EMBODIMENTS

Figure 1:
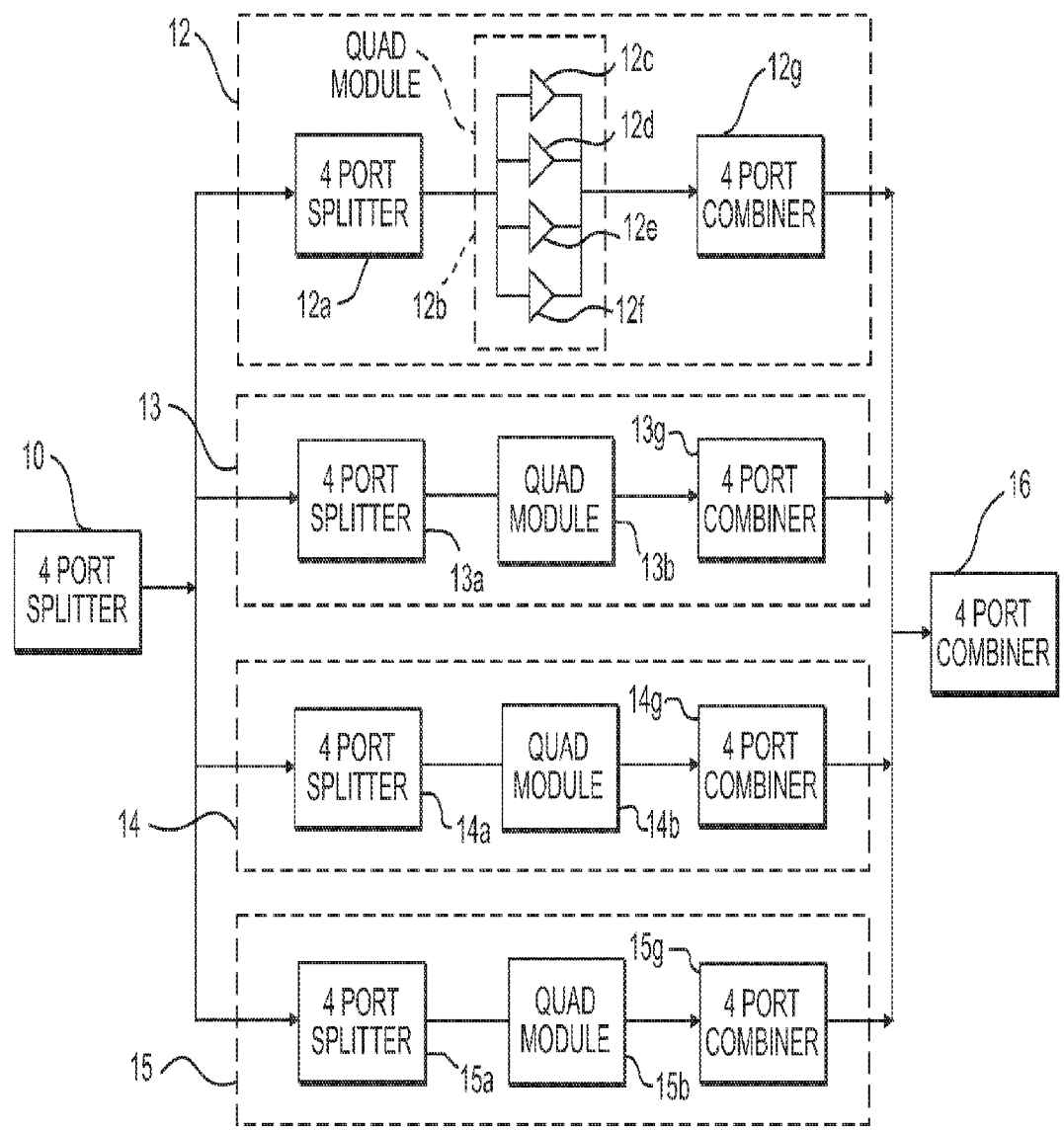
FIG. 1 is a block diagram of a power amplifier system in accordance with a preferred embodiment of the invention.

Referring to FIG. 1, there is shown a block diagram of a preferred embodiment of the overall system. The system includes a first four-port splitter 10 which receives a radio frequency (RF) input and the outputs of which are individually supplied to four modules 12, 13, 14 and 15. Modules 12 to 15 each comprise four power amplifier modules, referred to as quad modules, which are, in this specific embodiment, 1-kW (one kilowatt) modules. It will, of course, be understood that different modules and a different number of modules can be used.

Thus, considering module 12 as representative, module 12 includes a four-port power splitter or power divider 12a, a quad module 12b comprising four (e.g., 1 kW) power amplifier modules 12c, 12d, 12e and 12f, and a four-port power combiner 12g. Similarly, module 13 includes a four-port combiner or divider 13a, a quad module 13b, and four-port combiner 13g, and, as shown, modules 14 and 15 are also similar. Preferably, each of power dividers 12a, 13a, 14a and 15a and each of the combiners 12g, 13g, 14g and 15g are four-port, zero-degree phase input devices.

The outputs of combiners 12g, 13g, 14g and 15g are connected to an external four-port combiner 16 which produces the high power output, viz., an output approaching, in this embodiment, 16-kW of power. It is noted that the connecting cable lengths between components should be the same, i.e., each RF pathway should be of the same length.

Figure 2:
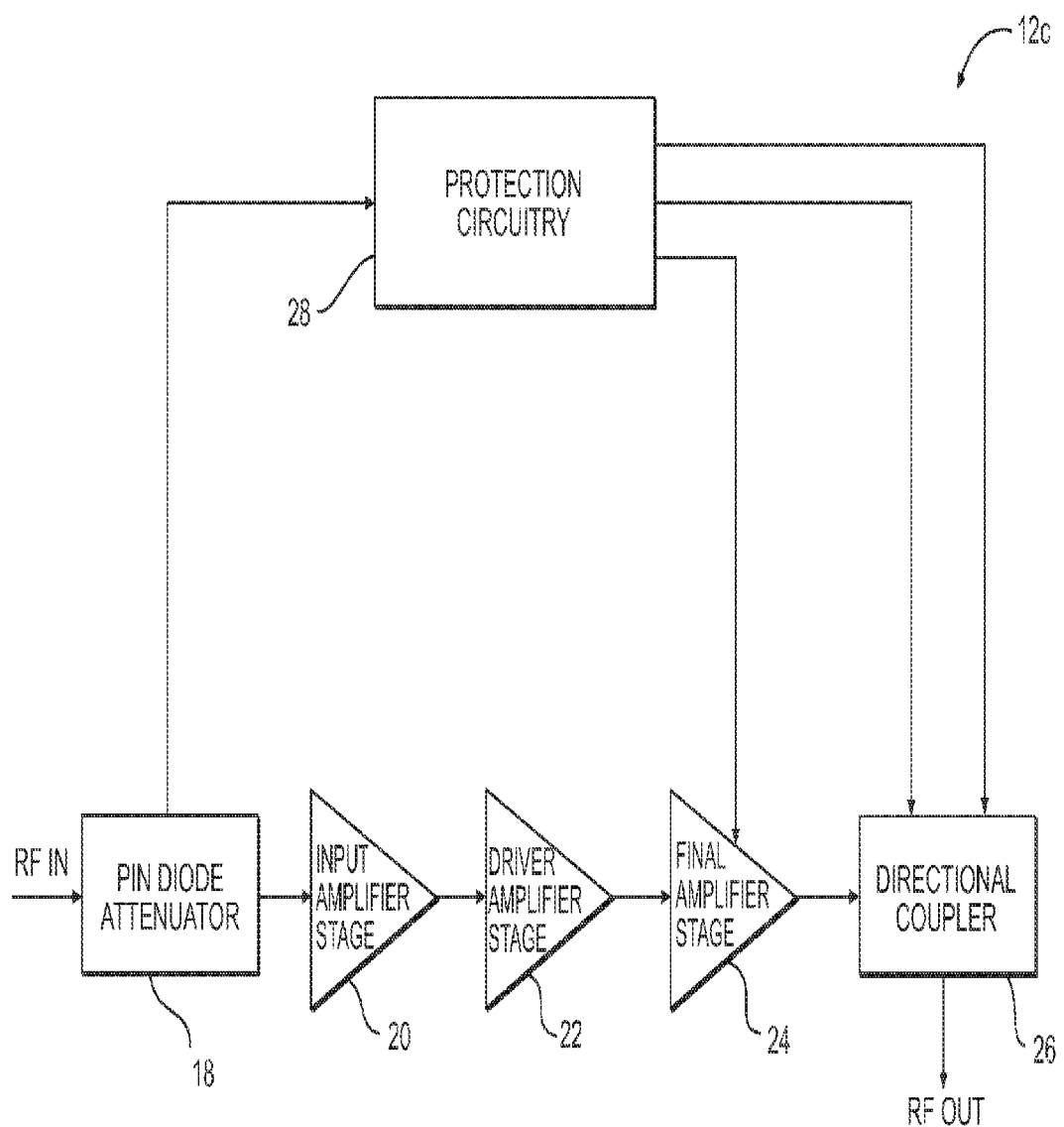
FIG. 2 is a block diagram of one of the amplifier stages of FIG. 1, constructed in accordance with a preferred embodiment of the invention.

Referring to FIG. 2, a block diagram is shown of one of the four power amplifier stages of one of the quad modules, i.e., one power amplifier stage of one of the quad modules 12b, 13b, 14b or 15b. Because all of the power amplifier stages are similar, it is only necessary to describe one stage (chosen here to be power amplifier stage 12c) as representative. As shown, the radio frequency input is supplied to a PIN diode attenuator 18, and three stages of RF power amplification are provided by (i) an input stage 20 connected to the output of attenuator 18, (ii) a driver stage 22, and (iii) a final amplification stage 24, all connected in series as shown. It will be appreciated that a PIN diode operates similarly to a variable resistor, with the resistance thereof being a function of the current flow through the PIN diode, more specifically, as more current passes through the PIN diodes of PIN diode attenuator 18, more of the output is shunted to ground instead of being supplied to the amplifier stages 20, 22 and 24, and thus the output power decreases. Although a different kind of attenuator could be used, PIN diode attenuators are the industry standard because their fast reaction and recovery times help protect the associated RF power device.

A four-port directional coupler 26 is connected to the output of final amplifier stage 24. In the exemplary embodiment under consideration, each stage (corresponding to stage 12b) will generate 1-kW of RF power with a 75-mW RF power input.

Protection circuitry 28, in the form of an automatic level control (ALC) circuit, protects the stage 12b from over power (excess power) operation, high VSWR (voltage standing wave ratio) operation, and high current, and acts to maintain a constant output power (which is variable between 0 and 1-kW in this embodiment). Protection circuitry 28 is described in more detail below in connection with FIG. 3.

External power supplies (not shown) of 65 VDC, 12.5 VDC and −15 VDC are connected to each quad system 12, 13, 14 and 15 and the voltages are distributed internally to all four 1-kW systems or modules of the quad system. A +15 VDC supply voltage (not shown) is generated internally from the 65 VDC supply for use by the ALC protection circuitry 28.

Figure 3:
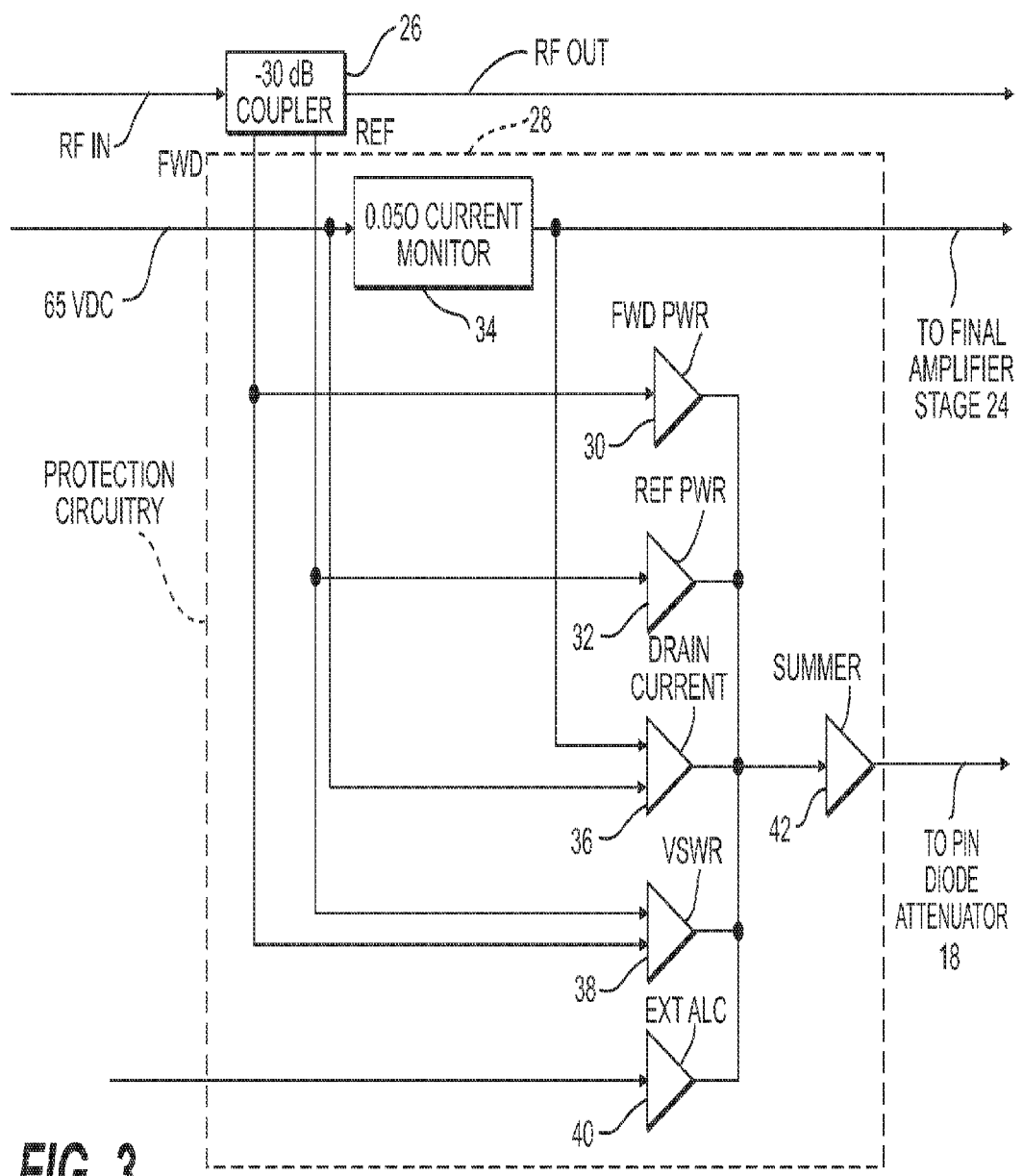
FIG. 3 is a schematic circuit diagram of a portion of the amplifier stage of FIG. 2 illustrating protection circuitry constructed in accordance with a preferred embodiment of the invention.

Referring to FIG. 3, a block diagram of the ALC circuit 28 is shown. Directional coupler 26, which is preferably a 1.5-kW 30-dB directional coupler in the specific embodiment under consideration, is used to sample the forward power (FWD) component and reflected power (REF) component of the output RF power. The forward power level is infinitely variable between 0 and 1-kW, and the corresponding output is connected to one input of an operational amplifier (op-amp) 30. The reflected power is monitored by a second op-amp 32 so that when the reflected power reaches 100-W, the ALC 28 reduces the output power to a point where a maximum of 100-W is allowed, regardless of the output power. For example, if the amplifier is operated into an open (or short) circuit, the reflected power is equal to the forward power and the total output power from the amplifier is limited to 100-W. As long as the reflected power never reaches 100-W, the output power from the amplifier will be limited by the forward power setting.

As indicated above, protection circuitry 28 also monitors the instantaneous DC current into the RF module. To this end, a current monitor 34 is provided which is formed, in this embodiment, by inserting a 0.05 ohm resistor in series with the abovementioned 65-VDC power supply going to the RF devices. A further op-amp 36 is connected across current monitor (resistor) 34 and when the current monitor 32 detects DC current above a predetermined level (which is 30-A (30 amperes) in the specific embodiment under consideration), the current monitor arrangement begins to "fold back," i.e., reduce, the power to maintain a safe level. In other words, by using the current monitor 32, once the current exceeds a preset level set by the user, the ALC 28 varies the current supplied to the PIN diode attenuator 18 which reduces the overall output power of the system, thus "folding back" the output power.

The forward and reflected components sampled by coupler 26 are also both fed to a further op-amp 38 which compares the two and provides an output indicative of the VSWR.

Another op-amp 40 receives a further input to ALC circuitry 28. This input is an external voltage level, and in the exemplary embodiment under consideration, this level ranges between 0 and 5 VDC, where 0 VDC equals no ALC protection and 5 VDC equals full ALC protection. In this way, external shaping of the RF waveform can be achieved. Thus, the input to ALC circuitry 28 is an external user defined waveform and this input can be of any type desired to achieve the desired RF output power waveform. For example, some cellular telephones have 10% "droop" in the RF power at the end of each pulse.

The outputs of op-amps 30, 32, 36, 38 and 40 are summed by a summer circuit 42. If the amplifier 40 is operating correctly, the FWD PWR portion of the ALC is the limiting factor with respect to the output power. As the REF PWR voltage or the IDD voltage rise, the output power will be reduced accordingly. (IDD refers to the drain current of the power devices.)

Considering FIGS. 2 and 3 together, the manner in which protection (ALC) circuitry 28 controls the RF output power produced by the amplifier of FIG. 2 is through the operation of the PIN diode attenuator 18 which receives the output of summer 42 and which controls the RF input drive to the input amplifier stage 20. In the exemplary embodiment under consideration, the PIN diode attenuator provides attenuation over a range from 0 to 60-dB and the attenuation is infinitely variable.

Although the invention has been described above in relation to preferred embodiments thereof, it will be understood by those skilled in the art that variations and modifications can be effected in these preferred embodiments without departing from the scope and spirit of the invention.

What is claimed is:

1. A high power, high frequency, solid state power amplifier system, comprising:
at least one input multiple port splitter for receiving a high-frequency input and for dividing the input into a plurality of outputs;
a plurality of solid state amplifier units, each amplifier unit including a plurality of amplifiers, and each amplifier being individually connected to one of the plurality of outputs of said further multiport splitters, and producing a corresponding amplified output;
at least one output multiport combiner for combining the amplified outputs of the amplifiers of each of the amplifier units to produce a combined output;
each of said amplifiers comprising a plurality of power amplifier stages and an automatic level control protection circuit for protecting the amplifier and for maintaining a substantially constant amplifier power output;
each of said protection circuits receiving a plurality of inputs related to the operational state of the corresponding amplifier and producing a related output;
each of said amplifiers comprising a variable power attenuator, connected to one of the plurality of outputs of the at least one multiple port splitter and to the output of the protection circuit, for controlling the high frequency input drive to a first amplifier stage of said plurality of amplifier stages;

each of said protection circuits including a directional coupler connected to the output of said amplifier stages for sampling the forward power component and reflected power component of the amplifier power output;

first and second separate operational amplifiers used in producing outputs related to the forward power component and the reflected power component, wherein the forward power component is determined by a user controlled forward power setting, and wherein the protection circuit provides that as long as the reflected power component does not exceed a predetermined level, the amplifier power output is limited the forward power setting; and, each of said protection circuit further comprises a current monitor for monitoring DC amplifier current and for reducing the amplifier power output when the DC amplifier current exceeds a predetermined level.

2. The system as claimed in claim 1 wherein said current monitor comprises a resistive component connected in series in a power supply connection to the plurality of amplifier stages.

3. The system as claimed in claim 2 wherein said protection circuit includes an operational amplifier for comparing said the forward power component and said reflected power component and for providing an output indicative of voltage standing wave ratio.

4. The system as claimed in claim 3 wherein said protection circuit includes an input terminal for receiving an external voltage level so as to enable shaping of the amplifier power output.

5. The system as claimed in claim 4 wherein said protection circuit further comprises a summer, connected to each of the operational amplifiers and the variable power attenuator, for summing the outputs of the operational amplifiers and for supplying a corresponding output to said variable power attenuator.

6. A high power, high frequency, solid state power amplifier system, comprising:

an input multiple port splitter for receiving a high-frequency input and for dividing the input into a plurality of outputs;

a plurality of further multiport splitters, said multiport splitters being equal in number to the number of outputs of the input splitter and each being individually connected to a respective output of said plurality of outputs, and each of said further multiport splitters producing a further plurality of outputs;

a plurality of solid state amplifier units, each amplifier unit including a plurality of amplifiers, and each amplifier being individually connected to one of the further plurality of outputs of said further multiport splitters and producing a corresponding amplified output;

a plurality of multiport combiners, equal in number to the number of further multiport splitters, for combining the amplifier outputs of the amplifiers of each of the amplifier units to produce a plurality of combined outputs;

an output multiport combiner for combining the plurality of combined outputs;

each of said amplifiers comprises a plurality of power amplifier stages and an automatic level control protection circuit for maintaining a substantially constant amplifier power output;

said protection circuit protects the associated amplifier from excess power operation, high voltage standing wave ratio operation and high current; and said protection circuit receiving a plurality of inputs related to the operational state of the corresponding amplifier and producing a related output, and each of said amplifiers comprising a variable power attenuator, connected to one of the plurality of outputs of the at least one multiple port splitter and to the output of the protection circuit, for controlling the high frequency input drive to a first amplifier stage of said plurality of amplifier stages.

7. The system as claimed in claim 6 wherein said variable power attenuator comprises a PIN diode attenuator.

8. The system as claimed in claim 6 wherein said protection circuit includes a directional coupler connected to the output of said amplifier stages for sampling the forward power component and reflected power component of the amplifier power output.

9. The system as claimed in claim 8 wherein first and second separate operational amplifiers are used in producing outputs related to the forward power component and the reflected power component, wherein the forward power component is determined by a user controlled forward power setting, and wherein the protection circuit provides that as long as the reflected power component does not exceed a predetermined level, the amplifier power output is limited to the forward power setting, said protection circuit further comprising current monitor for monitoring DC amplifier current and for reducing the amplifier power output when the DC amplifier current exceeds a predetermined level, and said current monitor comprising a resistive component connected in series in a power supply connection to the plurality of amplifier stages.

10. The system as claimed in claim 9 wherein said protection circuit includes an operational amplifier for comparing said the forward power component and said reflected power component and for providing an output indicative of voltage standing wave ratio, said protection circuit includes an input terminal for receiving an external voltage level so as to enable shaping of the amplifier power output, and said protection circuit further comprises a summer, connected to each of the operational amplifiers and said variable power attenuator, for summing the outputs of the operational amplifiers and for supplying a corresponding output to said variable power attenuator.

* * * * *